United States Patent
Takeuchi et al.

(10) Patent No.: US 7,264,146 B2
(45) Date of Patent: Sep. 4, 2007

(54) ULTRASONIC TOOL AND ULTRASONIC BONDER

(75) Inventors: Shuichi Takeuchi, Kawasaki (JP); Hidehiko Kira, Kawasaki (JP); Yukio Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 167 days.

(21) Appl. No.: 10/995,569

(22) Filed: Nov. 24, 2004

(65) Prior Publication Data

US 2005/0205641 A1   Sep. 22, 2005

(30) Foreign Application Priority Data

Nov. 27, 2003   (JP)   ............... 2003-396606

(51) Int. Cl.
- *B23K 5/20* (2006.01)
- *B23K 37/00* (2006.01)
- *B29C 65/00* (2006.01)
- *B32B 37/00* (2006.01)

(52) U.S. Cl. ............ 228/1.1; 228/4.5; 156/580.1; 156/580.2

(58) Field of Classification Search ........... 228/1.1, 228/4.5; 156/580.1, 580.2
See application file for complete search history.

(56) References Cited

U.S. PATENT DOCUMENTS

| | | | | |
|---|---|---|---|---|
| 3,861,938 A | * | 1/1975 | Jackson | 428/450 |
| 3,993,532 A | * | 11/1976 | McDonald et al. | 156/580.2 |
| 5,110,403 A | * | 5/1992 | Ehlert | 156/580.1 |
| 5,240,166 A | * | 8/1993 | Fontana et al. | 228/111.5 |
| 5,931,368 A | * | 8/1999 | Hadar et al. | 228/4.5 |
| 5,935,143 A | * | 8/1999 | Hood | 606/169 |
| 6,523,732 B1 | * | 2/2003 | Popoola et al. | 228/1.1 |

FOREIGN PATENT DOCUMENTS

| | | | |
|---|---|---|---|
| JP | 7-326619 | | 12/1995 |
| JP | 11-128837 | | 5/1999 |
| JP | 2000-068332 A | * | 3/2000 |
| JP | 2001-105159 | | 4/2001 |
| JP | 2005159070 A | * | 6/2005 |

* cited by examiner

*Primary Examiner*—Jonathan Johnson
*Assistant Examiner*—Lynne Edmondson
(74) *Attorney, Agent, or Firm*—Staas & Halsey LLP

(57) ABSTRACT

An ultrasonic tool, for bonding two materials to each other by joining a face of one of the materials to a face of the other material using the action of ultrasonic waves applied to one of the materials through another face of the one of the materials, wherein the ultrasonic tool has a coating layer comprising chromium oxide as a main component formed on at least the surface of the tool that is in contact with the face of the one of the materials through which the ultrasonic waves are applied to the one of the materials. An ultrasonic bonder provided with the ultrasonic tool is also disclosed.

16 Claims, 6 Drawing Sheets

ULTRASONIC TOOL AND ULTRASONIC BONDER

CROSS-REFERENCES TO RELATED APPLICATIONS

This application is based upon and claims the benefit of priority from prior Japanese Patent Application No. 2003-396606, filed on Nov. 27, 2003, the entire contents thereof being incorporated herein by reference.

BACKGROUND OF THE INVENTION

1. Field of the Invention

The present invention relates to an ultrasonic tool and an ultrasonic bonder. More specifically, the invention relates to an ultrasonic tool and an ultrasonic bonder having a feature, in its constitution, for improving the durability of the ultrasonic tool attached to an end of an ultrasonic bonder for flip-chip-bonding a semiconductor device or another electronic device, as well as for improving the efficiency for transmitting ultrasonic wave energy.

2. Description of the Related Art

An ultrasonic bonder has heretofore been known for bonding resin materials or metal materials. In an ultrasonic bonder, a base material and a material to be bonded to the base material are overlapped one upon the other, and are bonded together by utilizing the friction and the heat of friction that is generated when the surfaces to be bonded are slid at high frequency utilizing ultrasonic waves (see, for example, JP 2001-105159 A and JP 7-326619 A).

That is, when the junction surfaces are slid at a high frequency, the base material and the material to be bonded melt due to the friction and the heat of friction accompanying the sliding, or the oxide and the like on the surface of the base material and of the material to be bonded are removed, and a firm and strong bond is formed between resin materials or between the metal materials.

The above ultrasonic bonding has heretofore been employed when an electronic part having bumps formed on the lower surface thereof is to be mounted on a substrate. A conventional ultrasonic bonding process will be described below with reference to FIGS. 6A to 6D.

As shown in FIG. 6A, Cu pads 31 connecting to wiring patterns (not shown) are provided on a mounting substrate 30, and a solder resist 32 is provided to surround the Cu pads 31.

As shown in FIG. 6B, an under-filling resin 33 obtained by mixing an epoxy resin and a coupling agent is then applied so as to completely fill the space under an electronic part to be mounted, depending upon the size of the electronic part.

Subsequently, as shown in FIG. 6C, an electronic part 40 provided with Au bumps 42 having Cu pads 41 interposed between the respective bumps and the part is so placed that the Au bumps 42 of the electronic part 40 face the Cu pads 31 of the mounting substrate 30. An ultrasonic tool 51 made of a metal material containing Fe provided at an end of the ultrasonic bonder is then pushed onto the upper surface of the electronic part 40 to press the electronic part 40 to the mounting substrate 30 while applying ultrasonic waves, to thereby bond the Au bumps 42 of the electronic part 40 to the Cu pads 31 of the mounting substrate 30. In the drawing, reference numeral 52 denotes a horn that constitutes the ultrasonic bonder.

As shown in FIG. 6D, the under-filling resin 33 is thermoset to complete the mounting structure.

When the ultrasonic energy is applied while pressing the electronic part as described above, however, only up to about 60% of the applied energy is transmitted to the electronic part when a conventional ultrasonic tool is used. The 60% of energy transmission rate is herein calculated by dividing oscillation of an electronic part by oscillation of an ultrasonic tool.

Referring to FIG. 7, this is presumably due to that a slip occurs at the interface between the ultrasonic tool 51 and the electronic part 40 due to a low frictional resistance at the interface. When the mounting operation is continuously conducted using the above ultrasonic tool 51, both the ultrasonic tool 51 and the electronic part 40 are damaged.

Under such circumstances, the ultrasonic tool had to be removed and regenerated before the development of damage, requiring an increased number of steps and costs.

Besides, due to a large loss in the energy transmission, the bonding quality is not stable.

To enhance the energy transmission rate, in this case, it can be contrived to increase the frictional resistance by roughening the surfaces. If the surfaces are simply roughened, however, the surfaces of the electronic parts are damaged, and the mass-production thereof is hindered.

It is known to provide the surface of an ultrasonic tool with a coating. However, such a coating does not make it possible to improve both the energy transmission rate in ultrasonic bonding and the durability of an ultrasonic tool.

SUMMARY OF THE INVENTION

It is an object of the present invention to improve both the energy transmission rate in ultrasonic bonding and the durability of an ultrasonic tool.

According to the invention, there is provided an ultrasonic tool for bonding two materials to each other by joining a face of one of the materials to a face of the other material using the action of ultrasonic waves applied to one of the materials through another face of the one of the materials, wherein the ultrasonic tool has a coating layer comprising chromium oxide as a main component and formed on at least the surface of the tool that is in contact with the face of the one of the materials, through which the ultrasonic waves are applied to the one of the materials.

The coating layer may consist essentially of chromium oxide, or may contain chromium oxide and particles of other material or materials. Preferably, the material of the particles is a ceramic.

Preferably, the body of the tool is formed of a metal material containing iron. The metal material can be selected from the group consisting of carbon steels, stainless steels, and titanium steels.

Preferably, the coating layer has a thickness of 1 to 3 micrometers.

Also, preferably, the coating layer has a surface roughness Ra of 0.8±0.1 micrometers.

According to the invention, there is also provided an ultrasonic bonder provided with the ultrasonic tool of the invention. The ultrasonic bonder of the invention may have a source of ultrasonic energy and a horn for transmitting the ultrasonic energy to the ultrasonic tool.

DETAILED DESCRIPTION OF THE INVENTION

Figure 1:
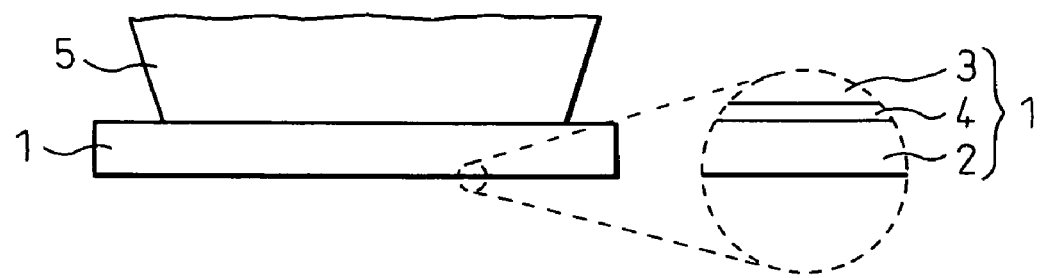
FIG. 1 illustrates the principle of the present invention.

FIG. 1 illustrates the principle of the present invention.

To solve the above problems, the present invention has a feature in that an ultrasonic tool 1 has a coating layer 2 comprising chromium oxide, as a main component, formed on at least the surface thereof that is in contact with a part to be bonded.

By providing such a chromium oxide-based coating layer 2 on the surface of the ultrasonic tool 1, it is made possible to avoid damage to the surface of the part to be bonded, and to realize a surface state of the ultrasonic tool capable of providing a sufficient frictional resistance between the tool and the part to be bonded and, hence, to improve the durability of the tool in a mass-production operation.

It was heretofore known that a coating layer can be provided on the surface of an ultrasonic tool. With the conventional coating layer, however, it is not possible to improve both the energy transmission rate, in ultrasonic bonding, and the durability of the ultrasonic tool.

The "ultrasonic tool" of the present invention stands for a tool that does not include a horn 5 (FIG. 1) in the case of a separate type in which the tool 1 is brazed to the horn 5, or stands for a tool that is part of the end of the horn 5 in the case of a type in which the tool 1 is integrated with the end of the horn 5.

The chromium oxide based coating layer 2 may be formed only of chromium oxide or may be formed of a material containing chromium oxide and particles such as ceramic particles incorporated to adjust the surface roughness of the coating layer 2.

As a base material 3 constituting the ultrasonic tool 1, it is preferable to use a metal material containing iron which hardly deforms at a temperature of 500 to 600° C. As the "metal material containing iron", there can be typically used a carbon steel, a stainless steel or a titanium steel in composition ranges specified under JIS standards.

In this case, when the thickness of the coating layer 2 exceeds 3 µm, the surface ruggedness of the ultrasonic tool 1 increases. When the film thickness exceeds 5 µm, in particular, it becomes difficult to maintain the flatness of the tool surface. When the film thickness is smaller than 1 µm, on the other hand, a desired durability is not obtained. It is therefore preferred that the thickness of the coating layer 2 is in the range of 1 µm to 3 µm to decrease the slipping at the interface and, hence, to increase the durability in a continuous mounting operation.

In this case, the thickness of the coating layer 2 stands for a thickness inclusive of a thickness of a compound layer 4 of iron and chromium formed at the interface with the base metal 3.

It is also preferred that the coating layer 2 has a surface roughness Ra (JIS standard) of 0.8 µm±0.1 µm. When the surface roughness Ra is too small, the frictional resistance decreases and the energy transmission rate decreases. When the surface roughness Ra is too great, the surface of the part to be bonded is damaged.

The surface roughness Ra is adjusted by grinding the surface of the coating layer 2 or by incorporating ceramic particles into the coating layer 2.

By providing the ultrasonic tool 1 having the above construction at the end of an ultrasonic bonder, it is made possible to realize an ultrasonic bonder featuring a high energy transmission rate and an excellent durability.

According to the present invention, as a coating layer comprising chromium oxide as a main component is provided on the surface of the ultrasonic tool, the ultrasonic tool exhibits an improved durability, thereby eliminating the need of a treatment for regenerating the ultrasonic tool, making it possible to decrease the cost while increasing the productivity.

Owing to the provision of the coating layer comprising chromium oxide as a chief component, there is no slipping at the interface, leading to the enhancement in the energy transmission rate, with the result that the bonding operations are carried out equally from one to another and the quality of products are improved.

In the present invention, the surface of a base material of a metal material containing iron, such as a carbon steel, a stainless steel or a titanium steel, is washed, the base material is then immersed in a solution containing a chromium compound such that the base material is impregnated with the chromium compound, followed by firing to form a coating layer comprising chromium oxide as a main component. These steps are repeated until the thickness of the coating layer reaches 1 to 3 µm and, finally, the surface of the coating layer is ground so that the surface roughness Ra is 0.8 µm±0.1 µm.

The ultrasonic tool thus produced is attached to a horn to complete an ultrasonic bonder.

The ultrasonic tool of a first embodiment of the invention will now be described with reference to FIGS. 2 to 4.

Figure 2:
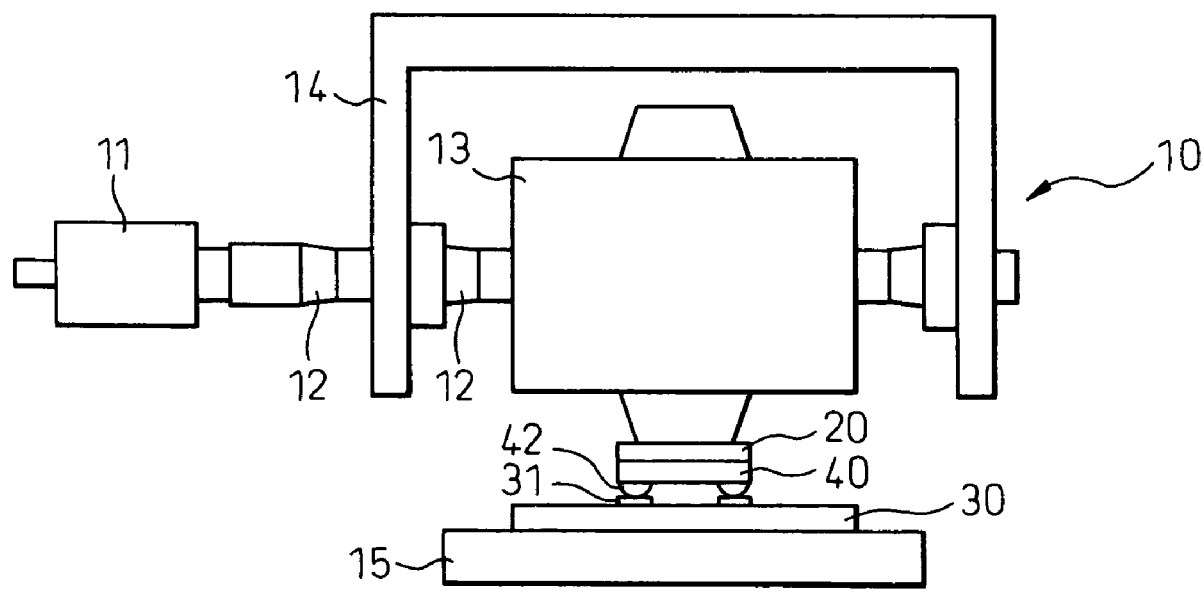
FIG. 2 schematically illustrates an ultrasonic bonder incorporating an ultrasonic tool according to a first embodiment of the present invention.

FIG. 2 schematically shows the construction of an ultrasonic bonder incorporating the ultrasonic tool according to the first embodiment of the present invention together with an electronic part for easy comprehension of the operation at the time of bonding.

The ultrasonic bonder 10 shown in the drawing comprises an ultrasonic tool 20, for effecting the bonding, in contact with an electronic part or the like, an oscillator 11 which is a source of ultrasonic oscillation, boosters 12 for controlling the amplitude of ultrasonic waves produced by the oscillator 11, a horn 13 for transmitting the ultrasonic waves from the boosters 12 to the ultrasonic tool 20 while maintaining a true sinusoidal waveform, and a horn holder 14 for mounting the horn 13 on an installation. A power source for supplying electric power to the oscillator 11 is not shown in the drawing.

For the ultrasonic bonding, the ultrasonic tool 20, which is brazed to the end of the ultrasonic bonder 10, is pushed onto the surface (upper surface) of the electronic part 40, the Au bumps of which 42 are facing the Cu pads 31 provided on a mounting substrate 30 placed on a stage 15. A pressure is then exerted on the electronic part 40 and, at the same time, ultrasonic waves are applied, such that the Au bumps 42 and the Cu pads 31 are slid and bonded together.

Referring to FIGS. 3A to 3D, a process for producing the ultrasonic tool according to the first embodiment of the invention will be described.

Figure 3A:
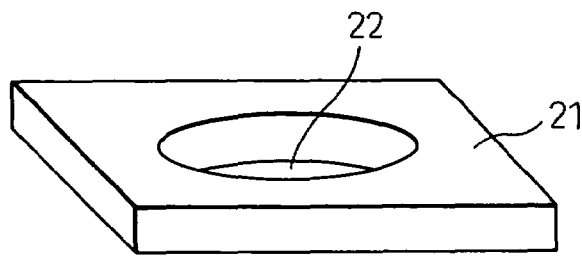
FIGS. 3A to 3D show the process for producing the ultrasonic tool according to the first embodiment of the present invention.

Referring to FIG. 3A, the coating surface of a base material 21 of, for example, a stainless steel having a rectangular parallelopiped shape measuring, for example, 12 mm long and 1 mm thick and having a vacuum adsorption hole 22 of a diameter of, for example, 5 mm at the central portion thereof, is cleansed by dewaxing, washing with an alkali, washing with an acid or the like.

Figure 3B:
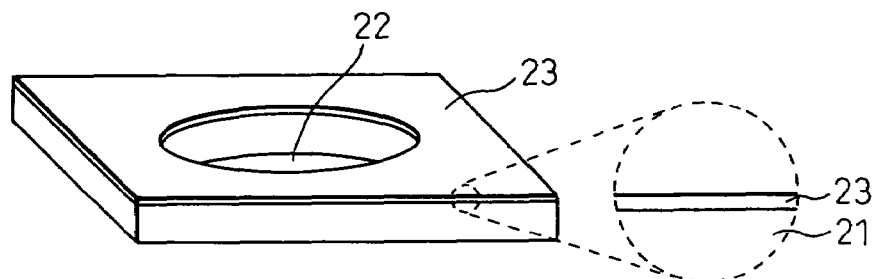

Referring to FIG. 3B, the base material 21 is then immersed in a solution containing a chromium compound, such as a compound of hexavalent chromium, so that at least the coating surface layer of the base metal 21 is impregnated with the chromium compound, which is represented by reference numeral 23 in the drawing.

Figure 3C:
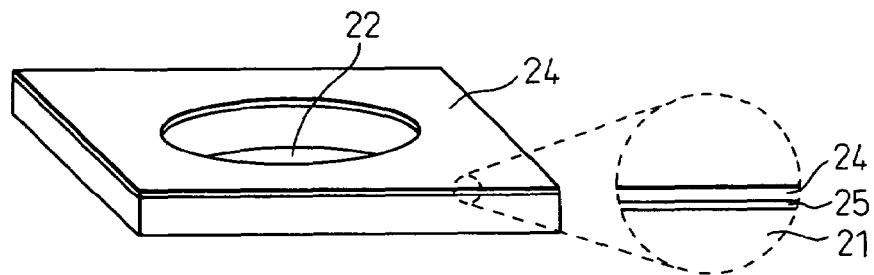

Next, the chromium compound 23 is oxidized by firing to form a thin coating film 24 containing chromium oxide as a main component (FIG. 3C). By this treatment, on the surface of the base material 21, iron which is the component of the base material 21 reacts with the chromium of the chromium compound to form a compound layer 25 made up of a compound of iron and chromium to provide a firm and thin coating layer 24.

Figure 3D:
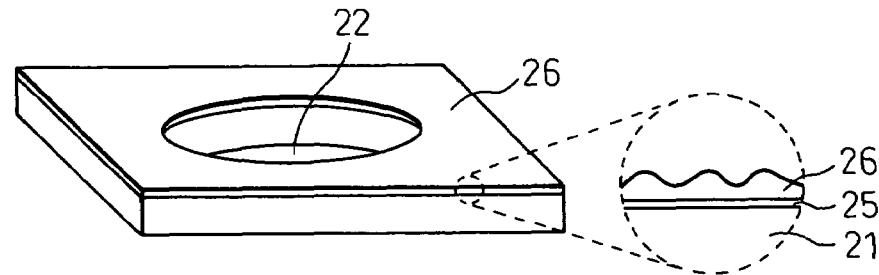

These steps are repeated until the thickness of the thin coating film 24 reaches 1 to 3 µm inclusive of the compound layer 25 to thereby form a coating film 26 (FIG. 3D).

Finally, the surface of the coating film 26 is ground to acquire a surface roughness Ra=0.8 µm±0.1 µm to complete the ultrasonic tool 20 of the first embodiment of the invention.

By using the ultrasonic bonder having the ultrasonic tool 20 of the first embodiment brazed to the end of the horn 13, the electronic part 40 was mounted on the mounting substrate 30, with the result that the energy transmission rate was improved by about 20% and the shearing strength (grams/bump) as measured by a shear measurement was greatly improved.

Figure 4:
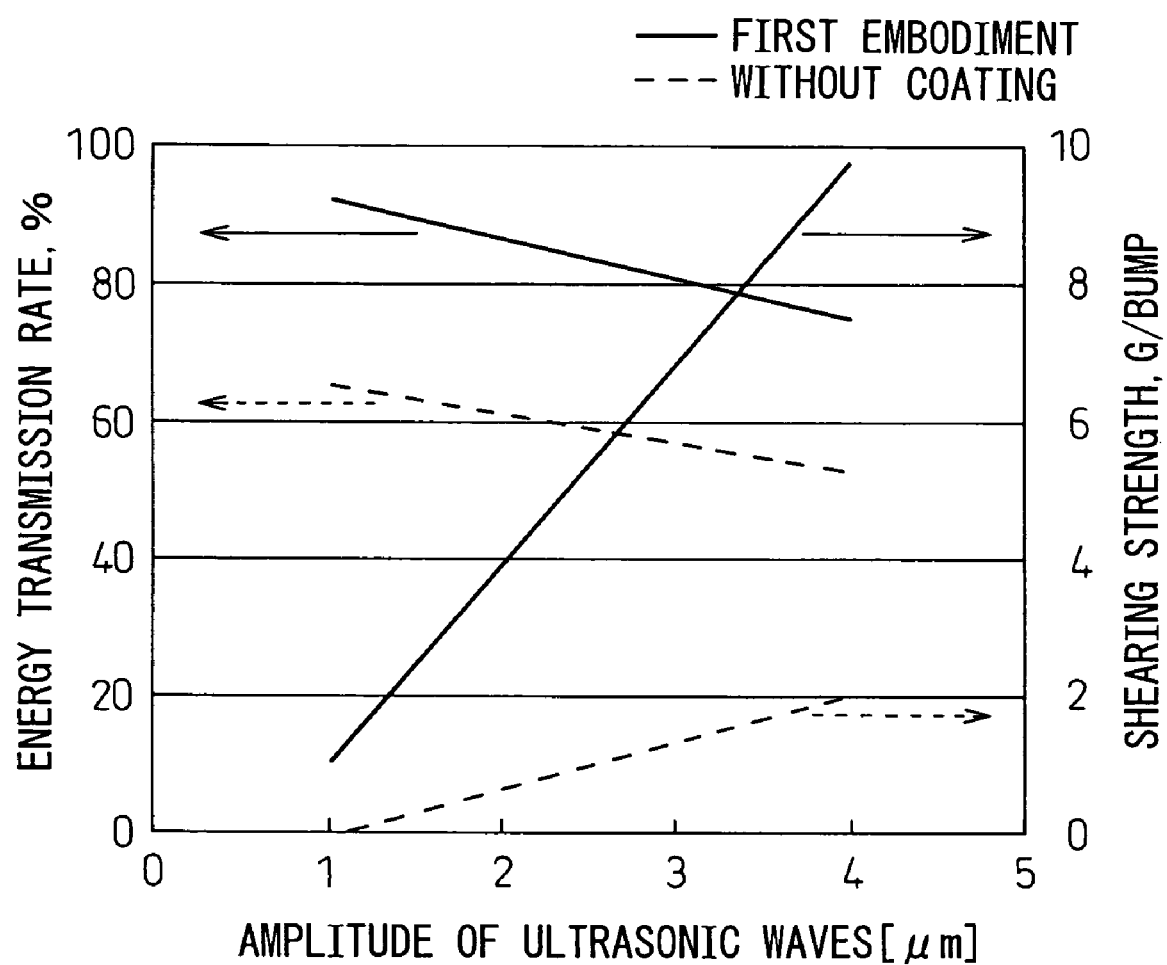
FIG. 4 is a diagram illustrating the dependence of the energy transmission rate and the shearing strength upon the amplitude of ultrasonic waves in the case where the ultrasonic bonding is effected by using the ultrasonic tool of the present invention.

FIG. 4 is a diagram illustrating the dependence of the energy transmission rate and the shearing strength upon the amplitude of ultrasonic waves in the case where the ultrasonic bonding is effected as described above. It shows the results in the case where the coating film 26 had a thickness of 2 µm, and a COC (chip on chip) of a square shape having a side of 8.5 µm was ultrasonic-bonded onto the silicon substrate of the same size. Namely, the results are those in the case where load was applied until it reached up to 10 g/bump and a high frequency of 50 kHz was then applied for 0.5 seconds.

The energy transmission rate decreases with an increase in the amplitude of ultrasonic waves but is still improved by about 20% as compared to the case of no coating film. This is presumably because the coefficient of friction is increased by the formation of the chromium oxide-based coating film having a surface roughness Ra lying in a suitable range and, hence, the energy transmission rate is increased.

The COC and the ultrasonic tool are initially fastened together relying simply upon the frictional resistance and vacuum adsorption. Accordingly, when the amplitude of ultrasonic waves is increased, the oscillating rate of the ultrasonic tool increases, and it becomes difficult to sufficiently hold the COC. It is believed that this accounts for the decrease in the energy transmission rate.

The shearing strength is sharply increased with an increase in the amplitude of ultrasonic waves, and is greatly improved as compared to the case of no coating film. This is presumably because the bonding surfaces are flattened and cleaned during the bonding by the Au bumps 42 rubbed against the Cu pad 31, and are cleansed to effect the bonding. Therefore, the friction increases with an increase in the amplitude, which yields a firmer bonding.

Table 1 summarizes hardnesses of various tools provided with no coating films and tools provided with different kinds of coating films, as well as an evaluation based on frequency of crack occurrence and silicon build-up.

TABLE 1

| | Surfaces of Ultrasonic Tools | | | | Evaluation | | |
| --- | --- | --- | --- | --- | --- | --- | --- |
| | Materials | Components | Hardnesses | | Cracks | Si Build-up | Judgment |
| Tools with coating films | Chromium oxide | Chromium oxide | Hv | 1700 | 0/15 | No | Good |
| | Lubricative plating | Ni, P, PTFE | Hv | 550 | 0/15 | YES | No good |
| | Chromium nitride | Cr•N | Hv | 1700 | 0/15 | YES | No good |
| | Aluminum titanium nitride | Ti•Al•N | Hv | 2500 | 0/15 | YES | No good |
| | Titanium nitride | Ti•N | Hv | 2100 | 0/15 | YES | No good |
| Tools with no coating film | USU420 | Cr•Ni•C | HRC | 50 | 0/15 | YES | No good |
| | Hard metal Z10 | Tungsten carbide, Fluorine carbide, Mo | Hv | 1710 | 0/15 | YES | No good |
| | Hard metal G5 | Tungsten carbide, Co | Hv | 1300 | 0/15 | YES | No good |
| | Micro grained hard alloy | Tungsten carbide, Fluorine carbide, Mo | HRA | 92 | 0/15 | YES | No good |
| | Non-magnetic hard alloy NM15 | Tungsten carbide, Co, Ni | HRA | 90 | 1/15 | YES | No good |
| | Sintered diamond PCD | Diamond particle, Ni, Co | Hv | 8000 | 1/15 | No | No good |
| | CVD diamond | 100% Diamond | Hv | 10000 | 0/15 | YES | No good |
| | DLC | C, H (Amorphous) | Hv | 3000 | 0/15 | YES | No good |

In the column of hardness of Table 1, HRC represents a Rockwell hardness that is suited for indicating a hardness of a plated film or the like, HRA represents a Rockwell A hardness suited for indicating a hardness of fine particles or the like, and Hv represents a Vickers hardness.

As will be obvious from Table 1, no crack occurred and no silicon built up only when the surface of the base material was coated with a film of chromium oxide.

"Silicon build-up" used herein stands for a phenomenon in which the silicon material of a COC builds up on the surface of a base material when a coating film is peeled therefrom or when no coating film is formed thereon.

Chromium oxide exhibits a suitable degree of hardness, i.e., Hv of 1700, and can therefore guarantee durability of a tool even in a continuous mounting operation in which a large number of parts are subjected to ultrasonic bonding.

The ultrasonic tool of a second embodiment of the invention will now be described with reference to FIGS. 5A to 5D.

Figure 5A:
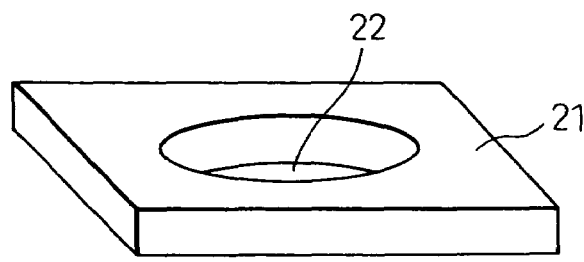
FIGS. 5A to 5D show the process for producing the ultrasonic tool according to a second embodiment of the present invention.

First, in the same manner as in the first embodiment, the coating surface of a base material 21 of, for example, a stainless steel having a rectangular parallelopiped shape measuring, for example, 12 mm long and 1 mm thick and having a vacuum adsorption hole 22 of a diameter of, for example, 5 mm at the central portion thereof, is cleansed by dewaxing, washing with an alkali, and washing with an acid or the like (FIG. 5A).

Figure 5B:
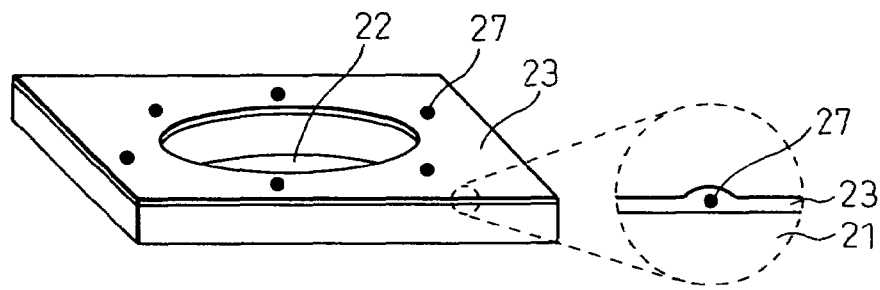

Referring to FIG. 5B, the base material 21 is then immersed in a solution containing a chromium compound, such as a compound of hexavalent chromium, as well as ceramic particles, so that at least the coating surface layer of the base material 21 is impregnated with the chromium compound containing ceramic particles, the chromium compound and the ceramic particles being indicated by reference numerals 23 and 27, in the drawing, respectively.

Figure 5C:
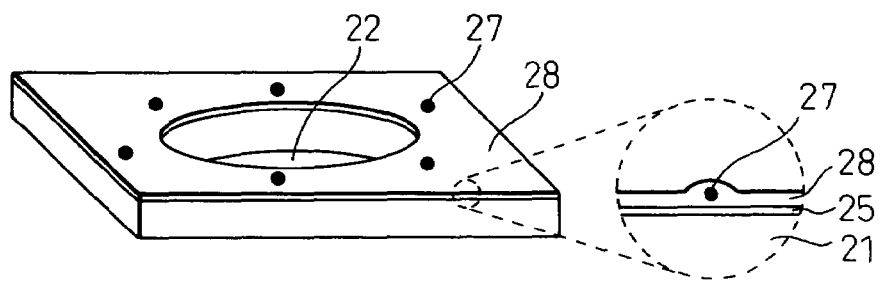

The chromium compound 23 is then oxidized by firing to form a thin coating film 28 containing chromium oxide as a main component and comprising ceramic particles 27, as shown in FIG. 5C. A compound layer 25 made up of a compound of iron and chromium is also formed on the surface of the base material 21, as in the first embodiment.

Figure 5D:
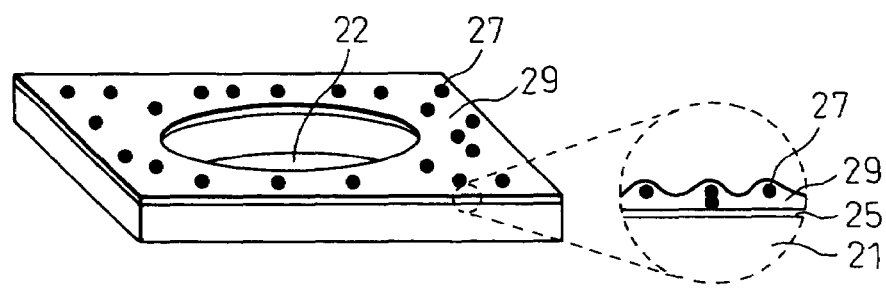
Figure 6A:
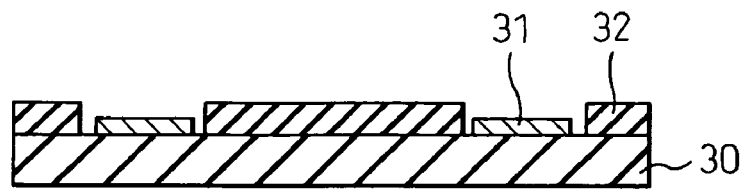
FIGS. 6A to 6D show a prior process for ultrasonic bonding.
Figure 6B:
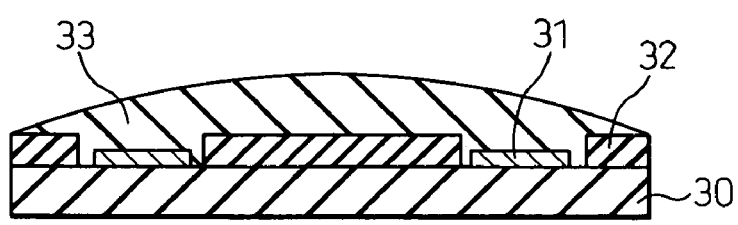
Figure 6C:
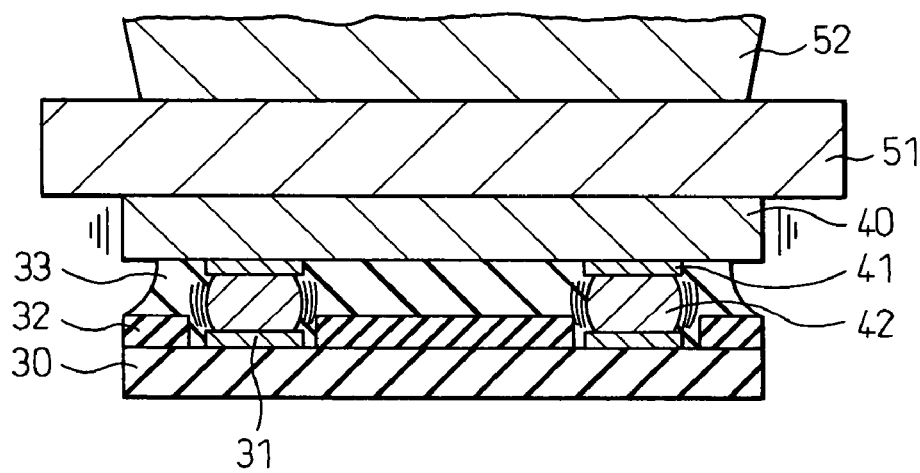
Figure 6D:
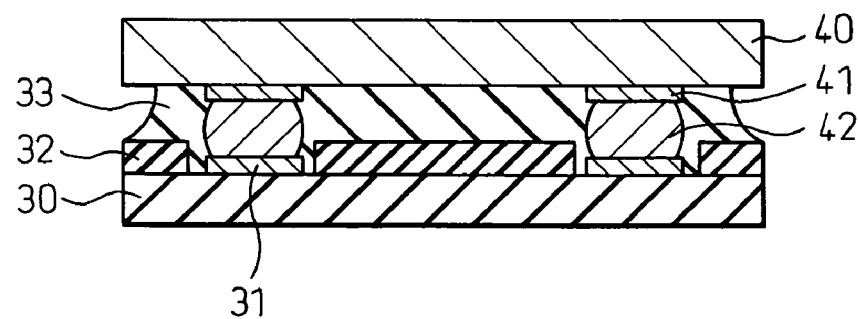
Figure 7:
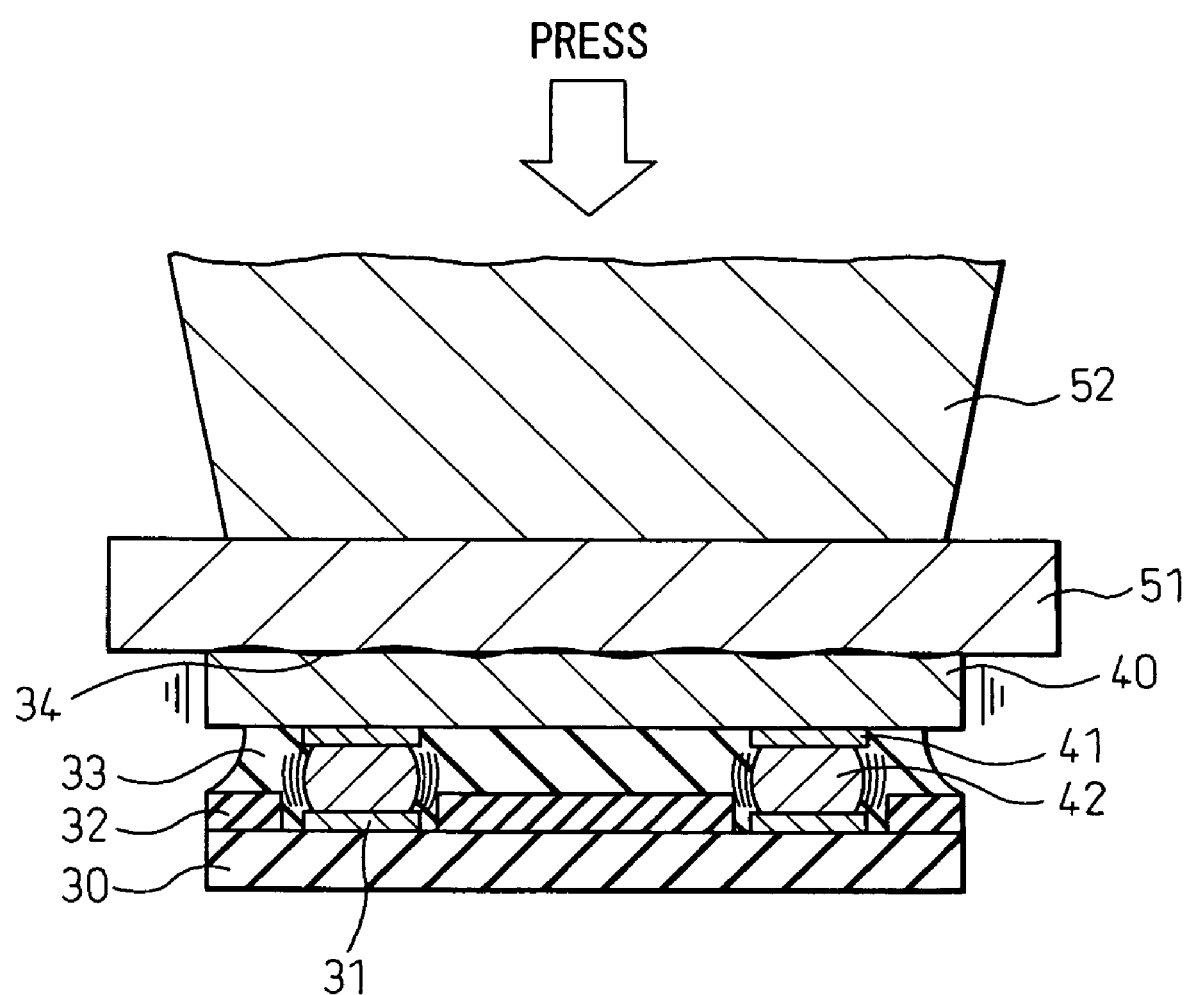
FIG. 7 illustrates problems in the prior process for ultrasonic bonding.

These steps are repeated until the thickness of the thin coating film 28 reaches 1 to 3 μm inclusive of the compound layer 25 to thereby form a coating film 29 having a surface roughness Ra of 0.8 μm±0.1 μm, the roughness having been resulted from the presence of the ceramic particles 27 (FIG. 5D).

In the second embodiment of the invention as described above, the ceramic particles 27 are mixed into the coating film 29, making it possible to control the surface roughness Ra of the coating film 29 depending upon the particle size of the ceramic particles 27 that are mixed and the mixing amount thereof.

Although the invention has been described referring to the embodiments thereof, it should be noted that the invention is in no way limited by the conditions and constructions described in the embodiments but can be modified in a variety of ways. For instance, the shape and size of the ultrasonic tool described in the embodiments are mere examples, and can be suitably varied depending upon the shape and size of the part that is to be bonded.

In the above embodiments, a stainless steel is used as the base material for the ultrasonic tool. Without being limited to the stainless steel, however, there may be used a metal material comprising iron as a main component, such as a carbon steel or a titanium steel, that hardly deforms at a temperature of 500 to 600° C. like stainless steel. The composition of the base material may be of the stainless steel, carbon steel or titanium steel specified under JIS standards.

In the above embodiments, the ultrasonic bonder comprises the ultrasonic tool and the horn that are separate from each other. The ultrasonic bonder, however, may comprise an ultrasonic tool and a horn which are integral together. In this case, although the surface of the horn may be provided with a coating film of chromium oxide, it is sufficient for the purpose of the invention that at least the surface thereof in contact with a part to be bonded is coated with the film of chromium oxide.

In the above embodiments, the boosters are combined together to realize the ultrasonic bonder of a type of amplifying or attenuating the amplitude of the ultrasonic waves. This is, however, only an example, and the invention may be applied to an ultrasonic bonder which controls the amplitude of the ultrasonic waves by adjusting the power of the power source itself.

In the bonding step using the ultrasonic tool of the above embodiment, the ultrasonic waves are applied after the pressure is elevated up to a predetermined load. However, the same effect is also obtained even when the pressure is gradually elevated up to the predetermined load while applying ultrasonic waves.

In the bonding step using the ultrasonic tool of the above embodiment, the ultrasonic bonding is effected after the under-filling resin is applied. Conversely, however, the ultrasonic bonding can be followed by the injection of the under-filling resin into beneath the electronic part and the curing thereof. In this case, the same effect is also obtained.

The present invention is typically utilized in flip-chip-bonding of a semiconductor chip. However, the body to be bonded is not limited to a semiconductor chip only, but may be another electronic part such as a ferroelectric device or a liquid crystal panel. Further, the objects to be bonded are not limited to those made of metal but may be made of resin.

The invention claimed is:

1. An ultrasonic tool for bonding two materials to each other by joining a face of one of the materials to a face of the other material using the action of ultrasonic waves applied to one of the materials through another face of the one of the materials, wherein the ultrasonic tool has a coating layer comprising chromium oxide as a main component and formed on at least a surface of the tool that is to be in contact with the another face of the one of the materials, through which the ultrasonic waves are applied to the one of the materials.

2. The ultrasonic tool of claim 1, wherein the coating layer consists essentially of chromium oxide.

3. The ultrasonic tool of claim 1, wherein the coating layer contains chromium oxide and particles of one or more other or materials.

4. The ultrasonic tool of claim 3, wherein the material of the particles is a ceramic.

5. The ultrasonic tool of claim 1, wherein the body of the tool is formed of a metal material containing iron.

6. The ultrasonic tool of claim 5, wherein the metal material is selected from the group consisting of carbon steels, stainless steels, and titanium steels.

7. The ultrasonic tool of claim 1, wherein the coating layer has a thickness in a range from 1 to 3 micrometers.

8. The ultrasonic tool of claim 1, wherein the coating layer has a surface roughness Ra of 0.8±0.1 micrometers.

9. An ultrasonic bonder used for bonding two materials to each other by joining a face of one of the materials to a face of the other material using the action of ultrasonic waves, the ultrasonic bonder comprising a source of ultrasonic energy, an ultrasonic tool for applying the ultrasonic energy to one of the materials, to be bonded while being in contact with the one of the materials, and a horn for transmitting the ultrasonic energy to the ultrasonic tool, wherein the ultrasonic tool has a coating layer comprising chromium oxide as a main component and formed on at least the surface of the tool, that is in contact with the face of the one of the materials, through which the ultrasonic waves are applied to the one of the materials.

10. The ultrasonic bonder of claim 9, wherein the coating layer of the ultrasonic tool consists essentially of chromium oxide.

11. The ultrasonic bonder of claim 9, wherein the coating layer of the ultrasonic tool contains chromium oxide and particles of other material or materials.

12. The ultrasonic bonder of claim 11, wherein the material of the particles is a ceramic.

13. The ultrasonic bonder of claim 9, wherein the body of the ultrasonic tool is formed of a metal material containing iron.

14. The ultrasonic bonder of claim 13, wherein the metal material is selected from the group consisting of carbon steels, stainless steels, and titanium steels.

15. The ultrasonic bonder of claim 9, wherein the coating layer of the ultrasonic tool has a thickness in a range from 1 to 3 micrometers.

16. The ultrasonic bonder of claim 9, wherein the coating layer of the ultrasonic tool has a surface roughness Ra of 0.8±0.1 micrometers.

* * * * *